(12) United States Patent
Kapusta et al.

(10) Patent No.: US 8,941,438 B2
(45) Date of Patent: Jan. 27, 2015

(54) BANDWIDTH LIMITING FOR AMPLIFIERS

(71) Applicant: Analog Devices, Inc., Norwood, MA (US)

(72) Inventors: Ronald A. Kapusta, Bedford, MA (US); Youn-Jae Kook, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 57 days.

(21) Appl. No.: 13/668,790

(22) Filed: Nov. 5, 2012

(65) Prior Publication Data

US 2014/0125407 A1    May 8, 2014

(51) Int. Cl.
*H03F 1/02* (2006.01)
*H03F 1/34* (2006.01)

(52) U.S. Cl.
USPC .................................................. 330/9; 330/86

(58) Field of Classification Search
USPC ............................... 330/75, 86, 107, 109, 144
See application file for complete search history.

(56) References Cited

U.S. PATENT DOCUMENTS

| 7,298,151 | B2 | 11/2007 | Kapusta et al. |
| 2013/0088291 | A1* | 4/2013 | Gorisse ........................... 330/75 |

* cited by examiner

*Primary Examiner* — Steven J Mottola
(74) *Attorney, Agent, or Firm* — Kenyon & Kenyon, LLP

(57) ABSTRACT

An apparatus for limiting the bandwidth of an amplifier provides for the design of an input impedance, a feedback impedance, and a load impedance such that the load impedance is proportional to the sum of the input impedance and feedback impedance. A sampling circuit has a load impedance including a resistor and capacitor in series to reduce the effective amplifier transconductance, which decreases bandwidth without increasing noise density or making this circuit more difficult to drive than a conventional circuit.

13 Claims, 5 Drawing Sheets

BANDWIDTH LIMITING FOR AMPLIFIERS

FIELD OF THE INVENTION

The present invention relates to amplifiers, more specifically to limiting the bandwidth of amplifiers.

BACKGROUND INFORMATION

Amplifiers are widely used in analog circuits, particularly for analog-to-digital converters ("ADCs"). ADCs convert an analog signal to a digital signal by sampling the analog signal, processing it, and converting it to a digital signal. One important property of sampling circuits is bandwidth. Because an analog signal is one comprised of many frequencies, the larger the bandwidth of the sampling circuit, the greater the range of frequencies that may be captured by the sampling circuit. The analog signal is then passed to a signal processor that ultimately outputs a digital signal. In analog circuit design, there is a trade-off between bandwidth and noise. As bandwidth increases, more signal information can be processed. However, a larger bandwidth also permits more noise to pass through the filter, and more noise power must then be tolerated by the signal processor. Therefore, as a general design principle, an analog circuit should be of the minimum bandwidth necessary to process the required signal with specified accuracy.

Limiting the bandwidth of circuits to the minimum required for processing the input reduces the noise sampled, which is beneficial for signal processing. This is illustrated with two examples. First, the sampling bandwidth of a switched-capacitor sampling circuit, as in FIG. 1A, is typically designed to be three to four times the maximum required input frequency to obtain good gain and phase flatness over the input range. However, if the maximum required input frequency is reduced by a factor of four, then ideally the sampling bandwidth should also be reduced by a factor of four. The reduced bandwidth would minimize the total noise power sampled from any circuitry driving the sampling circuit. Second, when an amplifier in feedback is used as an active sampling circuit, as in FIG. 1B, the bandwidth is typically designed to be ten times the maximum required input frequency to maintain good AC linearity (i.e., a spurious-free output) for all required input frequencies. Although the required bandwidth is wider relative to the signal frequency of the switched-capacitor sampling circuit, the amplifier should still be designed with the minimum bandwidth necessary, also for noise considerations. Both examples illustrate that regardless of the application, bandwidth should be limited for noise considerations.

Information relevant to attempts to address these problems can be found in U.S. Pat. No. 7,298,151. However, in the circuit of U.S. Pat. No. 7,298,151 (shown as FIG. 2), the DC gain is limited by how large the load resistive element ($R_L$) 208 can be made. This is because the DC gain from the input 204 of the transconductor to the output 205 is set by $g_m R_L$, where $g_m$ is the transconductance of the amplifier 212. Although there are many applications in which high DC gain is desirable, high DC gain is difficult to achieve, because DC gain is limited by how large $R_L$ can be made. If $R_L$ is too large, the circuit has issues related to parasitic capacitances including feedback loop instability.

In conventional circuit design, there are several ways to limit bandwidth. Two of the most common are described. In the first method, capacitance is increased to shunt some resistance in the signal path. In the example described above of the sampling circuit, as in FIG. 1A, this is accomplished by increasing the capacitance of sampling capacitor 114. In the example of the active sampling circuit, as in FIG. 1B, this is also accomplished by increasing the capacitance of sampling capacitor 106. However, one disadvantage of increasing capacitance, particularly at the input to the circuit, is the increased difficulty for the preceding circuit to drive the larger capacitive load, which may in turn increase the amount of overshoot and ringing at the output, and cause the driving circuit to be unstable.

Another way of limiting bandwidth in conventional circuit design is increasing resistance in series with the signal. In the circuit shown in FIG. 2, this is accomplished by increasing resistance in sampling switch 211. In an active sampling circuit, this is typically accomplished by decreasing the transconductance of the main amplifier input device. However, one disadvantage of increasing resistance is that it is accompanied by an increase in noise density. The noise of the sampling circuits in the presence of increased resistance is typically unchanged. Therefore, as the resistance increases, the bandwidth decreases, causing the noise density to increase. These effects offset each other. Furthermore, if some subsequent circuit has a fixed bandwidth, higher noise density results in increased overall noise.

Thus, there remains a need in the art for a way to limit the bandwidth of an amplifier that does not require either increasing the capacitance or increasing the resistance, which both negatively impact the performance of the circuit.

SUMMARY

An apparatus is described herein that provides for a circuit limiting the bandwidth of an amplifier. The circuit includes an amplifier, an input impedance, a feedback impedance, and a load impedance. The load impedance includes resistive and capacitive elements. In the exemplary embodiments according to the present invention, by fixing substantially constant the ratio of the load impedance to the sum of the feedback impedance and input impedance, the closed-loop bandwidth of the system is reduced due to the reduction of the effective amplifier transconductance. However, because the actual transconductance has not been reduced, the noise density of the amplifier is not increased. The input impedance also remains unchanged, which makes this circuit no more difficult to drive than a conventional circuit.

Advantages of the present invention include: neither increasing capacitance at the input to the amplifier (which would make the circuit difficult to drive) nor increasing resistance (which would increase the noise density of the circuit), and eliminating the penalties associated with lower transconductance amplifiers or increased switch resistance.

DETAILED DESCRIPTION

The subject invention will now be described in detail for specific preferred embodiments of the invention, it being understood that these embodiments are intended only as illustrative examples and the invention is not to be limited thereto.

Figure 2:
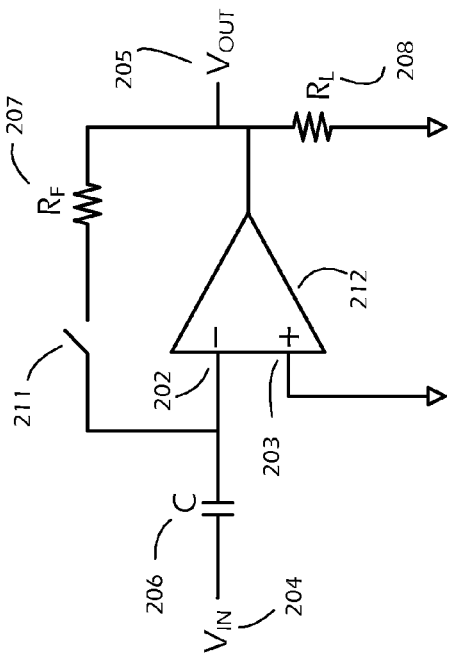
FIG. 2 shows a conventional method for limiting bandwidth in a sampling circuit as described in U.S. Pat. No. 7,298,151.
Figure 1A:
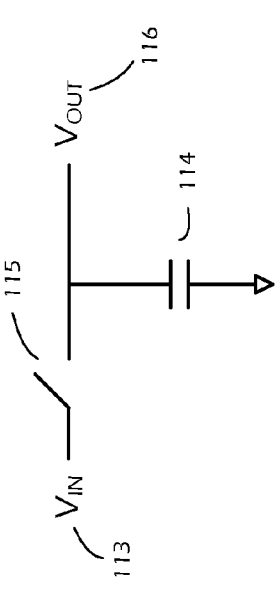
FIG. 1A shows a conventional method of sampling.
Figure 1B:
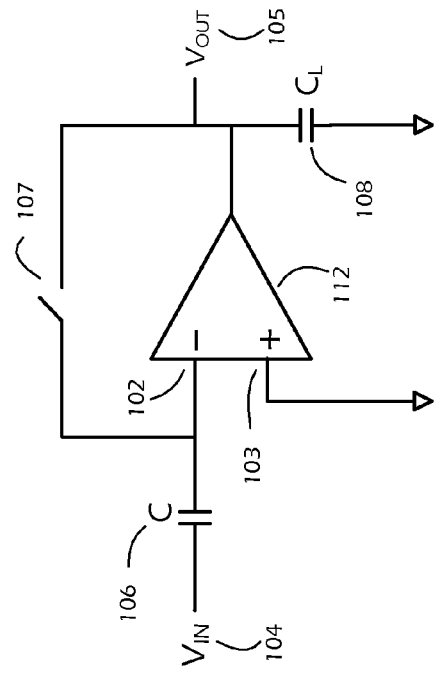
FIG. 1B shows a conventional method for limiting bandwidth in an active sampling circuit.
Figure 3:
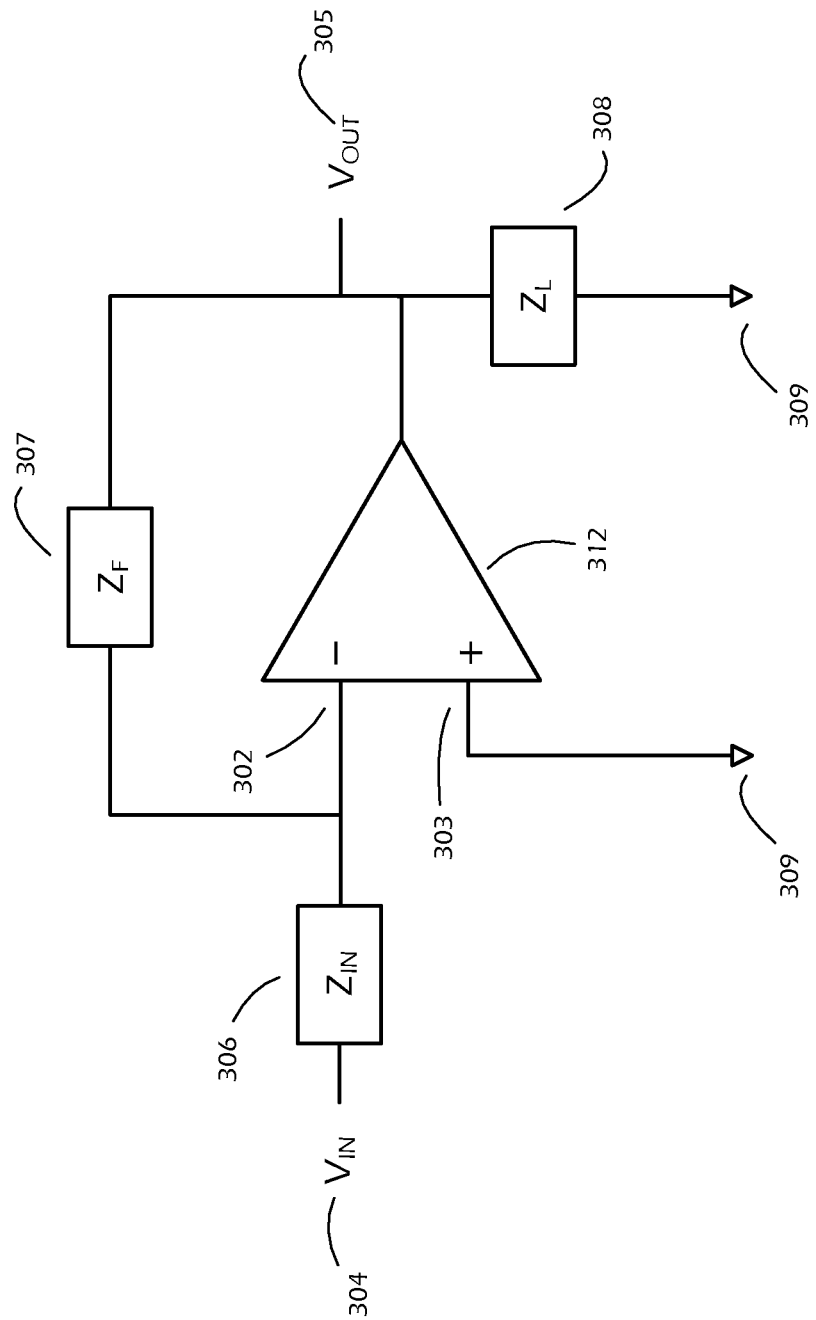
FIG. 3 shows an exemplary circuit comprising an input impedance, a load impedance, and a feedback impedance coupled to an amplifier, according to an embodiment of the present invention.

FIG. 3 shows an exemplary circuit according to the present invention. The circuit includes an amplifier 312 with its non-inverting input 303 tied to a reference potential 309, which may be ground (typically for a single-ended implementation) or a non-zero potential (typically for a differential implementation). An input impedance ($Z_{IN}$) 306 is coupled to the inverting input 302 of amplifier 312. A feedback impedance ($Z_F$) 307 is coupled to the output 305 of amplifier 312 and the inverting input 302. A load impedance ($Z_L$) 308 is coupled to the output 305 of amplifier 312 and reference potential 309. Input impedance 306, feedback impedance 307, and load impedance 308 are abstractions of any combination of resistances and capacitances.

Figure 4:
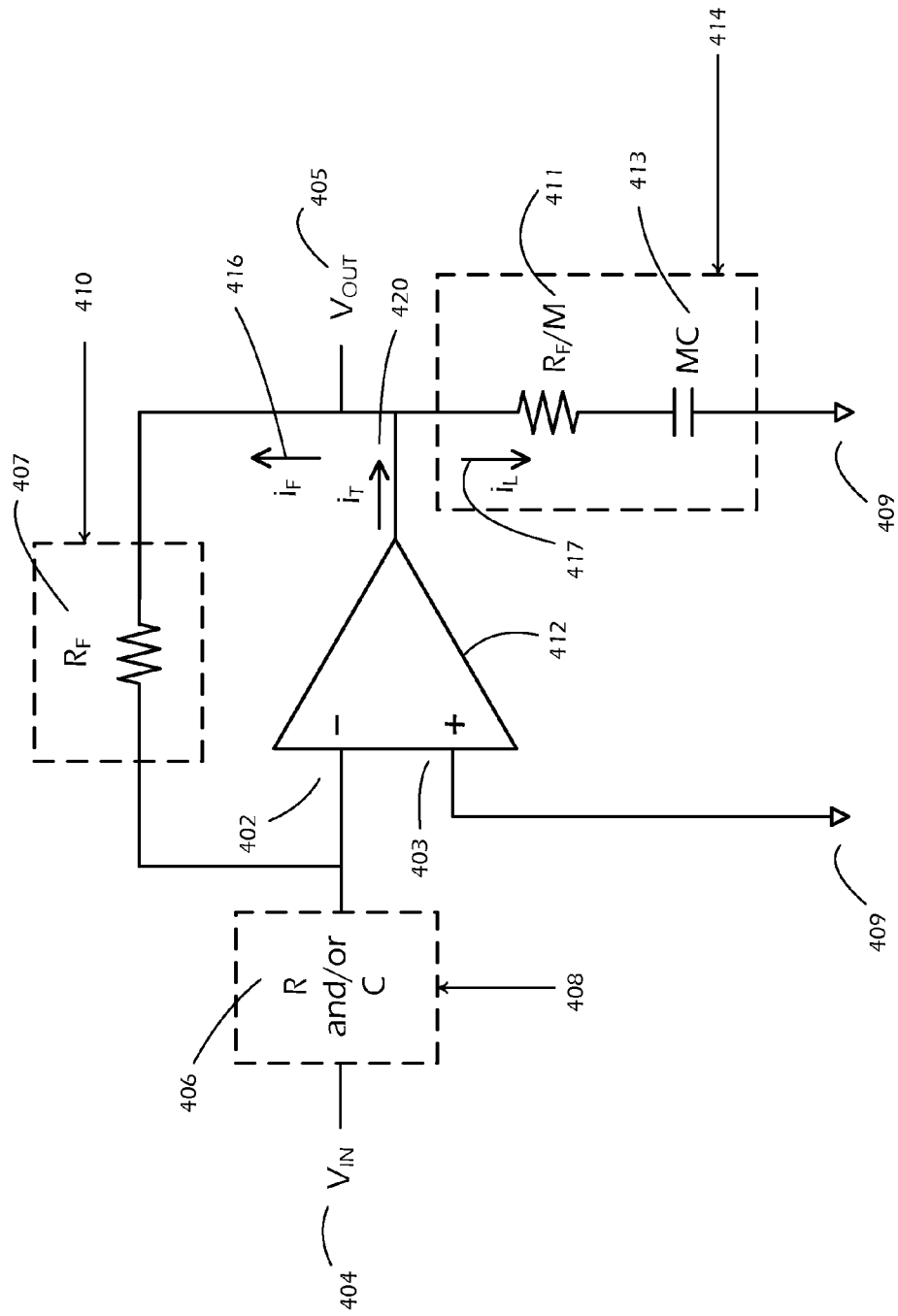
FIG. 4 shows an exemplary circuit having a load impedance comprising a resistor and a capacitor connected in series, according to an embodiment of the present invention.

FIG. 4 shows an exemplary circuit having a load impedance 414 comprising a resistor 411 and a capacitor 413 connected in series, according to an embodiment of the present invention. In FIG. 4, exemplary circuit elements have been provided for impedance blocks 306, 307, and 308 of FIG. 3. Resistors and/or capacitors 406 produce input impedance 408, a resistor 407 produces feedback impedance 410, and a resistor 411 and capacitor 413 connected in series produces load impedance 414. M represents any value selected in the design of the circuit to scale load resistor 411 and load capacitor 413. This circuit decreases bandwidth without decreasing the input impedance, decreasing the amplifier transconductance, or increasing the output noise density. This is accomplished by reducing the effective amplifier transconductance.

Because an ideal transconductance amplifier has infinite input and output impedances, current flowing out of the amplifier must either flow through feedback resistor 407 or load resistor 411. At high frequencies, capacitors act as short circuits (capacitor impedance approaches zero as frequency approaches infinity). Thus, load capacitor 413 will act as a short circuit to ground (or a reference potential) 409, and input resistors and/or capacitors 406 acts as a short circuit to the input potential, which is ideally a zero impedance source. The circuit of FIG. 4 will then become a current divider formed by feedback resistor 407 and load resistor 411. The total amplifier current is represented by (iT) 420. A portion of the amplifier current will flow through load resistor 411 to ground 409, which is represented by load current (iL) 417. The remaining portion of the amplifier current will flow back to the input source 404 through feedback resistor 407, which is represented by feedback current (iF) 416. The formula for a current divider provides that iL, the portion of the current flowing through load resistor 411 is $$\frac{M}{M+1} \times i_T.$$

The portion of the current flowing through feedback resistor 407, iF, is $$\frac{1}{M+1} \times i_T$$

(in other words, iF+iL equals the total amplifier output current). Even if the input voltage source were not an ideal voltage source, the current split ratio is adjusted somewhat, but the overall function remains the same. Furthermore, load resistor 411 may be adjusted to account for a non-zero source resistance such that the current split ratio is maintained exactly as desired.

At low frequencies, capacitors have very large impedances that dominate over resistance. However, the feedback current ($i_F$) 416 flowing through feedback resistor 407 remains $$\frac{1}{M+1} \times i_T,$$

and the portion of the current flowing through load resistor 411 remains $$\frac{M}{M+1} \times i_T.$$

The current-splitting ratio remains substantially constant for all frequencies, because the load impedance 414 is M times smaller than the impedance 410 in the feedback path.

Given that only a portion of the amplifier output current is flowing through the feedback path as represented by $i_F$ 416, the effective amplifier transconductance is reduced by a factor of $$\frac{1}{M+1}.$$

For an amplifier connected in a negative feedback loop, the closed loop bandwidth is proportional to the transconductance of the loop, where the loop transconductance is defined as the ratio of the change in current that flows through the feedback loop in response to a change in voltage at the amplifier input. Because the current splitting ratio causes only a small portion of the amplifier output current to be directed back through the feedback path, the bandwidth of the system is reduced by the same factor, $$\frac{1}{M+1}.$$

However, because the actual amplifier transconductance has not been altered, the noise density of the amplifier is not increased (voltage thermal noise density is proportional to transconductance), and there is no penalty in terms of noise density. Moreover, the input impedance is unchanged, which makes this circuit no more difficult to drive than a conventional circuit.

So long as $Z_L$ is designed to have a comparable or lower impedance than the total impedance of the feedback path ($Z_F+Z_{IN}$) for all frequencies of interest (in other words, the ratio of $Z_L$ to ($Z_F+Z_{IN}$) is less than or equal to 1), bandwidth will be limited. When $Z_L<(Z_F+Z_{IN})$, substantially more amplifier output current flows to the load impedance and not to the feedback path, reducing the effective amplifier transconductance, which in turn reduces the loop bandwidth.

Figure 5:
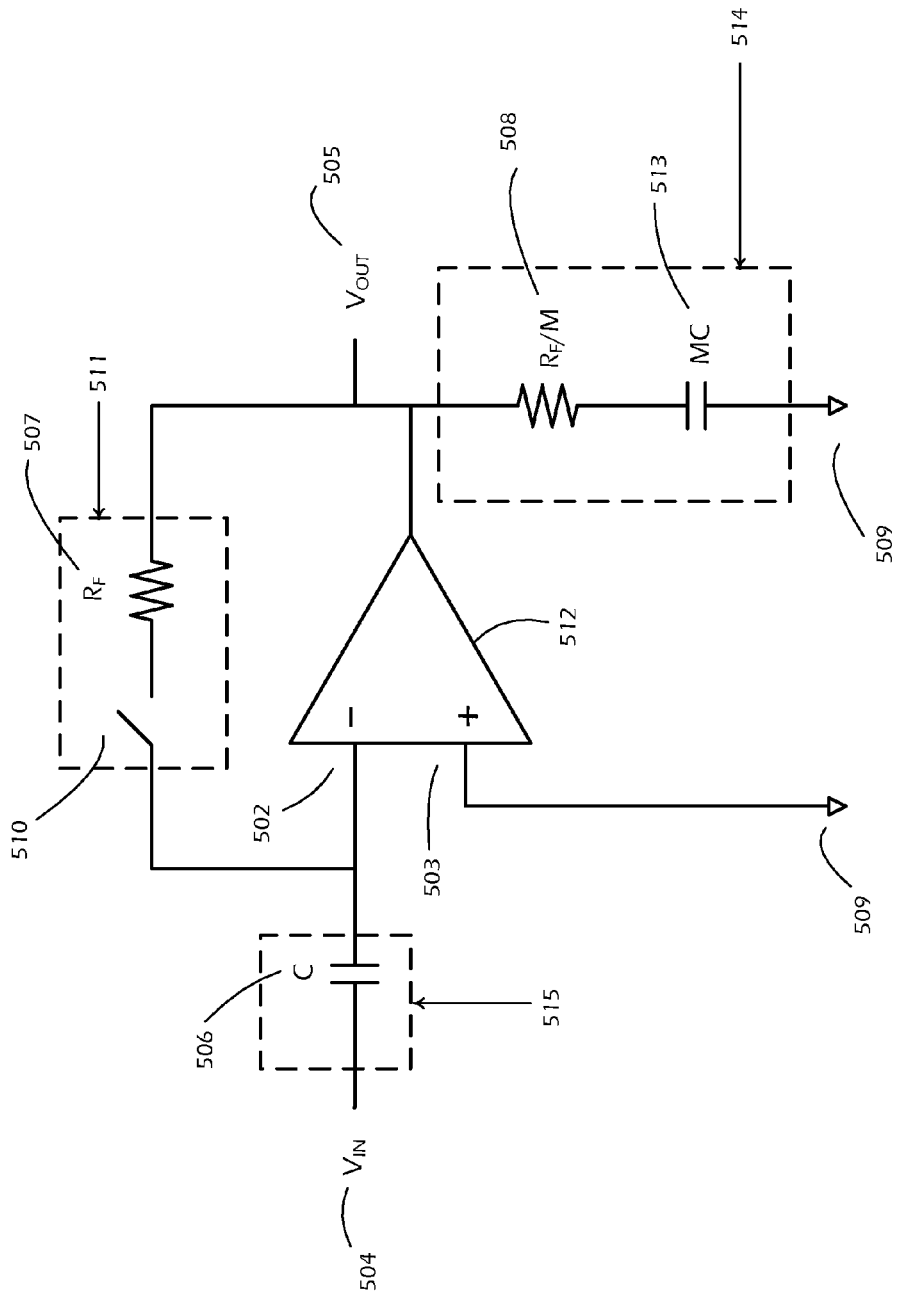
FIG. 5 shows an exemplary sampling circuit according to an embodiment of the present invention.

FIG. 5 shows an exemplary sampling circuit according to an embodiment of the present invention. It is the circuit of FIG. 4 with an added switch 510. Switch 510 is connected in series with feedback resistor 507. When switch 510 is opened, the charge on sampling capacitor 506 is frozen and a sample is taken. The load resistor 508 and load capacitor 513 solves the issue of noise at output node 505 and on sampling capacitor 506 being dominated by switch resistance as described above.

Figure 6:
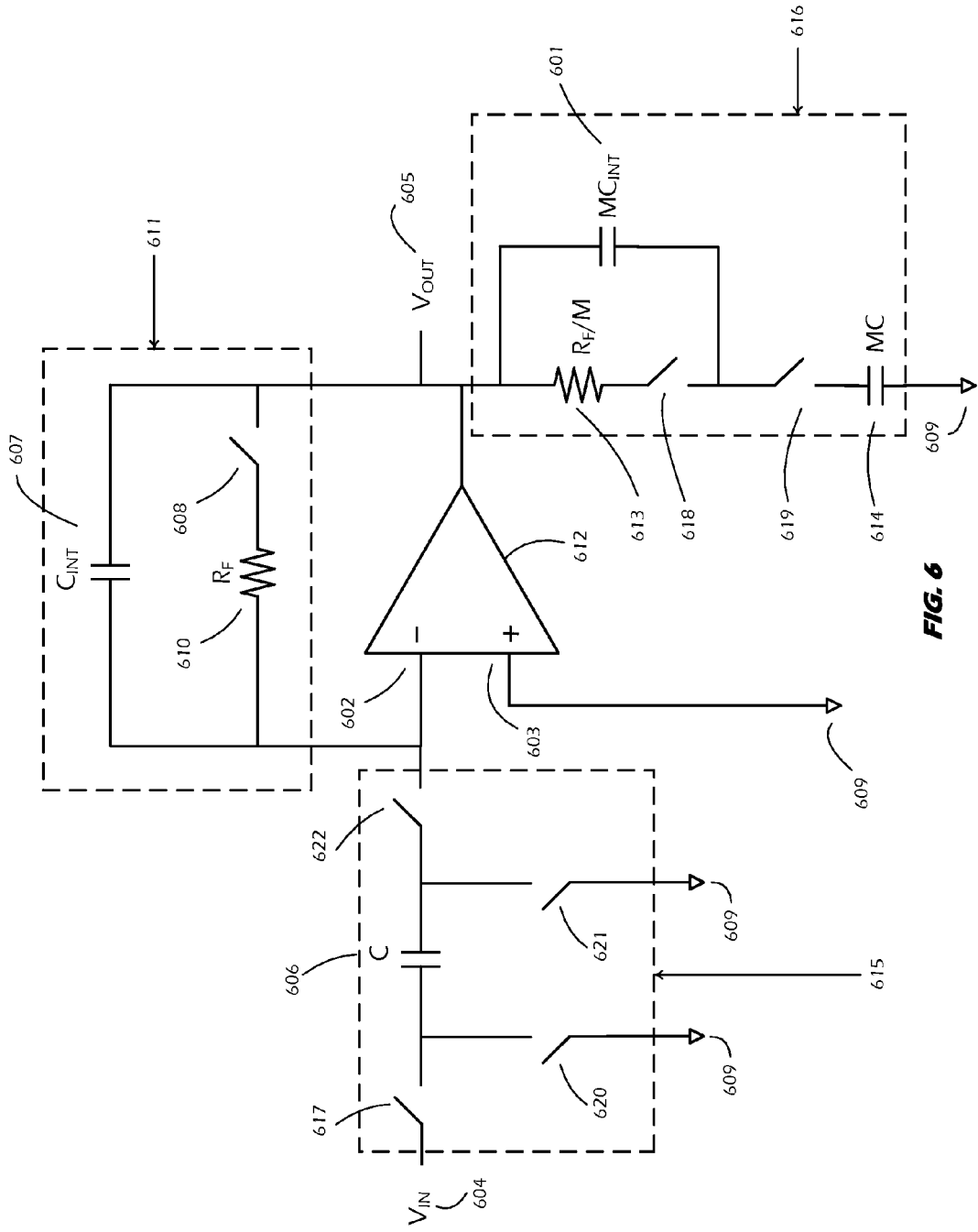
FIG. 6 shows an exemplary switched-capacitor discrete time integrator according to an embodiment of the present invention.

FIG. 6 shows an exemplary switched-capacitor discrete time integrator according to an embodiment of the present invention. The operation of the switches samples charge on capacitor 606, then transfers it to feedback capacitor 607, where the charge is integrated. During the sampling phase, switches 617 and 621 are on, sampling the input voltage on input capacitor 606. During the transfer phase, switches 617 and 621 are off, and switch 620 is on, transferring the sampled charge on capacitor 606 to feedback capacitor 607. The integrator may be periodically reset with the feedback switch 608 and switch 618. Feedback resistor ($R_F$) 610 may be used to control the dynamics of the reset period. In this embodiment of the invention, the shunt load path 616 is a scaled version of the feedback path 611. The input impedance 615 and feedback impedance 611 are determined by the desired transfer function of the circuit. This embodiment of the invention (as well as FIG. 5 above) illustrate that various forms of impedances and switches may be used. Switches may be replicated (and scaled) on load path 616 and controlled in the same manner. For example, when feedback switch 608 is on, an added load switch 618 is also on, and vice versa. An additional load switch may be coupled to the load capacitor 614 and reference potential 609 if switch resistance is large relative to resistors 610 and 613. Switch 619 may be placed in series with load capacitor 614 to match the switching characteristic of input impedance 615. For a further example, a continuous time integrator could be designed to have a resistive input impedance 306 and a capacitive feedback impedance 307.

The exemplary embodiments above show circuits with a ratio fixed for all frequencies. However, the ratio need not be constant for all frequencies. For example, the relation could be:

$$Z_L = f(x)(Z_F + Z_{IN})$$

where f(x) is a function of the input frequency. There remains a fixed relationship between $Z_L$ and $(Z_F + Z_{IN})$, but the ratio varies with input frequency. For example, in FIG. 4, if load capacitor 413 has a value of MC, but load resistor 411 had a smaller value of $$\frac{R_F}{2M},$$

at very low frequencies, the feedback current ($i_F$) 416 would be $$\frac{1}{M+1}.$$

At very high frequencies, the feedback current would be even lower as $$\frac{1}{2M+1}.$$

This would provide optimized noise or loop performance. The exemplary embodiments above show single-ended circuits, but it will be appreciated that the same principles hold for differential circuits as well. For example, FIG. 6 includes an amplifier 612 with its non-inverting input 609 tied to a reference potential, which may be ground for a single-ended implementation or a non-zero potential for a differential implementation. Alternative embodiments with an inverting input of the amplifier tied to reference potential and a non-inverting input of the amplifier tied to the input or load impedance are possible as well. Alternative embodiments having an amplifier with a single input are possible as well.

The descriptions and illustrations of the embodiments above should be read as exemplary and not limiting. Modifications, variations, and improvements are possible in light of the teachings above and the claims below, and are intended to be within the spirit and scope of the invention.

What is claimed is:
1. A circuit comprising:
an amplifier including an input and an output;
an input impedance coupled to the input of the amplifier;
a feedback impedance coupled to the input of the amplifier and the output of the amplifier; and
a load impedance, including a first resistor and a first capacitor, coupled to the output of the amplifier;
wherein a ratio of the load impedance to a sum of the feedback impedance and the input impedance is at least substantially constant for all input frequencies.
2. The circuit of claim 1, wherein:
the input impedance includes a second capacitor; and
the feedback impedance includes a second resistor.
3. The circuit of claim 1, wherein the first resistor and the first capacitor of the load impedance are connected in series.
4. The circuit of claim 2, wherein the first resistor and the first capacitor of the load impedance are connected in series.
5. The circuit of claim 4, wherein the load impedance further includes:
a third capacitor connected in parallel with the first resistor of the load impedance.
6. The circuit of claim 5, wherein the feedback impedance further includes:
a fourth capacitor connected in parallel with the second resistor.
7. The circuit of claim 6, further comprising:
a first switch connected in series with the second capacitor of the input impedance and a reference potential.
8. The circuit of claim 1, wherein:
the input impedance includes a second resistor;
the feedback impedance includes a second capacitor.
9. The circuit of claim 4, further comprising:
a second switch connected in series with the second resistor of the feedback impedance.
10. The circuit of claim 4 wherein an output of the second capacitor of the input impedance is coupled to an input of the second resistor of the feedback impedance.
11. A circuit comprising:
an amplifier including an input and an output;
an input impedance coupled to the input of the amplifier;
a feedback impedance coupled to the input of the amplifier and the output of the amplifier;

a load impedance, including a first resistor and a first capacitor connected in series, wherein the load impedance is coupled to the output of the amplifier; and a third capacitor connected in parallel with the first resistor of the load impedance;

wherein a ratio of the load impedance to a sum of the feedback impedance and the input impedance is at least substantially constant for all input frequencies.

12. The circuit of claim 11, further comprising:

a first switch connected in series with the second capacitor of the input impedance and a reference potential.

13. A circuit comprising:

an amplifier including an input and an output;

an input impedance coupled to the input of the amplifier;

a feedback impedance coupled to the input of the amplifier and the output of the amplifier; and a load impedance, including a first resistor and a first capacitor, coupled to the output of the amplifier;

a second switch connected in series with the second resistor of the feedback impedance;

wherein the load impedance is less than a sum of the feedback impedance and the input impedance for all input frequencies.

* * * * *